United States Patent
Kao

(10) Patent No.: US 12,288,801 B2
(45) Date of Patent: Apr. 29, 2025

(54) SEMICONDUCTOR STRUCTURE AND METHOD OF MANUFACTURE

(71) Applicant: TAIWAN SEMICONDUCTOR MANUFACTURING COMPANY LIMITED, Hsin-Chu (TW)

(72) Inventor: Ching-Hung Kao, Tainan (TW)

(73) Assignee: TAIWAN SEMICONDUCTOR MANUFACTUING COMPANY LIMITED, Hsin-Chu (TW)

( * ) Notice: Subject to any disclaimer, the term of this patent is extended or adjusted under 35 U.S.C. 154(b) by 374 days.

(21) Appl. No.: 17/682,721

(22) Filed: Feb. 28, 2022

(65) Prior Publication Data
US 2023/0275121 A1   Aug. 31, 2023

(51) Int. Cl.
H01L 49/02   (2006.01)

(52) U.S. Cl.
CPC .................... H01L 28/20 (2013.01)

(58) Field of Classification Search
CPC ..... G11C 17/16; H01L 28/20; H01L 27/0629; H01L 27/0288; H01L 27/0802; H01L 23/5256; H01L 23/2525
See application file for complete search history.

(56) References Cited

U.S. PATENT DOCUMENTS

| | | | |
|---|---|---|---|
| 2008/0094168 A1 | 4/2008 | Hynes et al. | |
| 2009/0039480 A1* | 2/2009 | Lee | H01L 23/5256 |
| | | | 257/E23.149 |
| 2009/0267177 A1* | 10/2009 | Ide | H10B 41/40 |
| | | | 257/516 |
| 2013/0299994 A1* | 11/2013 | Park | H01L 21/76883 |
| | | | 438/653 |
| 2014/0167182 A1 | 6/2014 | Nandakumar et al. | |

FOREIGN PATENT DOCUMENTS

| | | |
|---|---|---|
| TW | 495959 B | 7/2002 |
| TW | 200516670 A | 5/2005 |
| TW | 201123344 A | 7/2011 |

* cited by examiner

*Primary Examiner* — John A Bodnar
(74) *Attorney, Agent, or Firm* — Cooper Legal Group, LLC

(57) ABSTRACT

A semiconductor structure includes a first dielectric layer, a conductive layer over the first dielectric layer, and a first electrode over a first portion of the conductive layer. A first thickness of the first portion of the conductive layer is greater than a second thickness of a second portion of the conductive layer not under the first electrode.

20 Claims, 8 Drawing Sheets

SEMICONDUCTOR STRUCTURE AND METHOD OF MANUFACTURE

BACKGROUND

Semiconductor structures are used in a multitude of electronic devices, such as mobile phones, laptops, desktops, tablets, watches, gaming systems, and various other industrial, commercial, and consumer electronics. The semiconductor structures include active devices, such as transistors, and passive devices, such as resistors and capacitors. The dimensions of semiconductor structures have been decreasing as the density of components within semiconductor arrangements has been increasing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
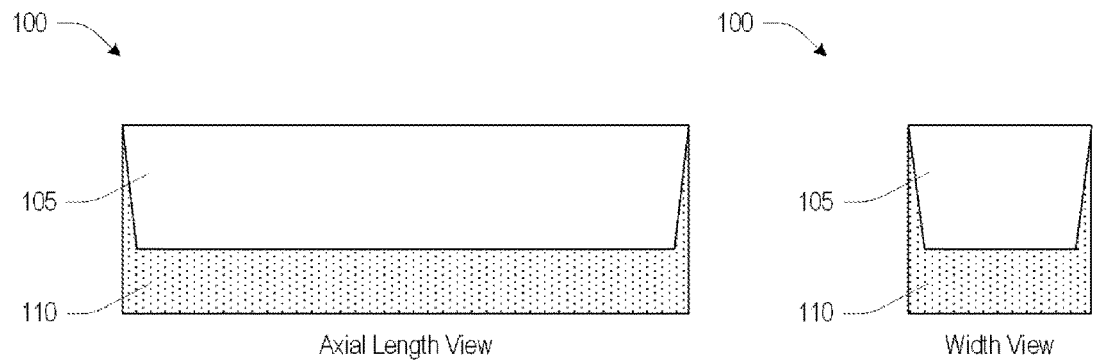
FIGS. 1-11 are illustrations of a semiconductor structure at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower." "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present application relates to one or more semiconductor structures and/or one or more methods for fabricating one or more semiconductor structures. According to some embodiments, a semiconductor structure, such as comprising a resistor, has a first dielectric layer and a conductive layer over the first dielectric layer. An electrode is formed over a first portion of the conductive layer. A thickness of a second portion of the conductive layer not under the electrode is reduced compared to a thickness of the first portion of the conductive layer under the electrode. The thickness of the second portion of the conductive layer is reduced by implementing different techniques as provided herein. In some embodiments, a removal process, such as an etch process, is used to remove at least some of the second portion of the conductive layer and thereby reduce the thickness of the second portion of the conductive layer. In some embodiments, a modification process, such as an oxidation process, is used to modify or convert at least some of the second portion of the conductive layer to a different material and thereby reduce the thickness of the second portion of the conductive layer. In some embodiments, both a removal process and a modification process are used to reduce the thickness of the second portion of the conductive layer.

The resistance of the resistor is proportional to the length of the conductive layer and inversely proportional to the thickness of the conductive layer. The resistance of the resistor therefore increases as the length of the conductive layer increases and/or as the thickness of the conductive layer decreases, and the resistance of the resistor decreases as the length of the conductive layer decreases and/or as the thickness of the conductive layer increases. Reducing the thickness of the conductive layer allows the resistance of the resistor to be increased without having to increase the length of the conductive layer and/or allows the length of the conductive layer to be decreased without decreasing the resistance of the resistor. Maintaining or lessening the length of the conductive layer allows the footprint of the resistor to be maintained or reduced while also increasing or maintaining the resistance of the resistor. Having a smaller or reduced footprint while maintaining or increasing the resistance of the resistor is desirable to increase packing density of devices per unit area of valuable semiconductor real estate.

FIGS. 1-11 illustrate a semiconductor structure 100 at various stages of fabrication, in accordance with some embodiments. FIGS. 1-11 illustrate implementation of a removal process, such as an etch process, to reduce a thickness of a conductive layer, according to some embodiments. FIGS. 1-11 include an axial length view of a resistor to be formed in the semiconductor structure 100 taken in a direction corresponding to an axial length of the resistor and a width view taken through the resistor in a direction corresponding to a width of the resistor.

Referring to FIG. 1, a shallow trench isolation (STI) structure 105 is formed in a semiconductor layer 110. In some embodiments, the semiconductor layer 110 is part of a substrate comprising at least one of an epitaxial layer, a single crystalline semiconductor material such as, but not limited to at least one of Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer. In some embodiments, the semiconductor layer 110 comprises at least one of crystalline silicon or other suitable materials. Other structures and/or configurations of the semiconductor layer 110 are within the scope of the present disclosure.

In some embodiments, the STI structure 105 is formed by forming at least one mask layer over the semiconductor layer. In some embodiments, the mask layer comprises a layer of oxide material over the semiconductor layer 110 and a layer of nitride material over the layer of oxide material, and/or one or more other suitable layers. At least some of the layer of mask layer is removed to define an etch mask for use as a template to etch the semiconductor layer 110 to form a trench. A dielectric material is formed in the trench to define the STI structure 105. In some embodiments, the STI structure 105 includes multiple layers, such as an oxide liner, a nitride liner formed over the oxide liner, an oxide fill material formed over the nitride liner, and/or other suitable materials.

In some embodiments, a fill material is formed using a high density (HDP) plasma process. The HDP process uses precursor gases comprising at least one of silane (SiH4), oxygen, argon, or other suitable gases. The HDP process includes a deposition component, which forms material on surfaces defining the trench, and a sputtering component, which removes or relocates deposited material. A deposition-to-sputtering ratio depends on gas ratios employed during the deposition. According to some embodiments, Argon and oxygen act as sputtering sources, and the particular values of the gas ratios are determined based on an aspect ratio of the trench. After forming the fill material, an anneal process is performed to densify the fill material. In some embodiments, the STI structure 105 generates compressive stress that serves to compress the active region 115. Other structures and/or configurations of the STI structure 105 are within the scope of the present disclosure.

Although the semiconductor layer 110 and the STI structure 105 are illustrated as having coplanar upper surfaces at an interface 120 where the semiconductor layer 110 abuts the STI structure 105, the relative heights can vary. For example, the STI structure 105 can be recessed relative to the semiconductor layer 110 or the semiconductor layer 110 can be recessed relative to the STI structure 105. The relative heights at the interface 120 depend on the processes performed for forming the STI structure 105, such as at least one of deposition, planarization, mask removal, surface treatment, or other suitable techniques.

Figure 2:
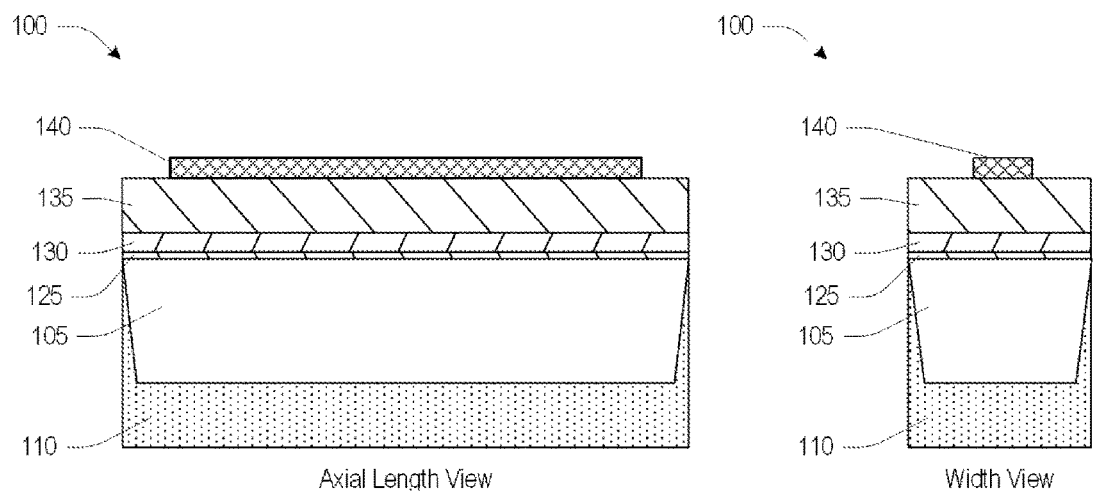

Referring to FIG. 2, a plurality of layers is formed over the semiconductor layer 110, in accordance with some embodiments. A dielectric layer 125 is formed over the STI structure 105 and the semiconductor layer 110, a conductive layer 130 is formed over the dielectric layer 125, a sacrificial layer 135 is formed over the conductive layer 130, and a mask 140 is formed over the sacrificial layer 135. At least one of the dielectric layer 125, the conductive layer 130, the sacrificial layer 135, or the mask 140 is formed by at least one of atomic level deposition (ALD), physical vapor deposition (PVD), chemical vapor deposition (CVD), atomic layer CVD (ALCVD), low pressure CVD (LPCVD), ultra-high vacuum CVD (UHVCVD), reduced pressure CVD (RPCVD), molecular beam epitaxy (MBE), liquid phase epitaxy (LPE), spin coating, growth, thermal evaporation, plating, or other suitable techniques.

In some embodiments, the dielectric layer 125 comprises a high-k dielectric layer. As used herein, the term "high-k dielectric" refers to the material having a dielectric constant, k, greater than about 3.9, which is the k value of $SiO_2$. Examples of the material of the high-k dielectric layer include at least one of $Al_2O_3$, $HfO_2$, $ZrO_2$, $La_2O_3$, $TiO_2$, $SrTiO_3$, $LaALO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, $SiON$, $Si_xN_y$, $ZrO_2/Al_2O_3/ZrO_2$, $Al_2O_3/ZrO_2/Al_2O_3$, $ZrO_2/Al_2O_3/ZrO_2/Al_2O_3$, a silicate thereof, an alloy thereof, or other suitable materials. Values of x vary independently from 0.5 to 3, and values of y vary independently from 0 to 2. Other structures and/or configurations of the dielectric layer 125 are within the scope of the present disclosure. In some embodiments, the conductive layer 130 comprises at least one of TiN, Mo, Ru, Ir, Pt, PtSi, MON, Al, W, HfN, WN, $NiSi_x$, $ZrSi_2$, $MoSi_2$, $TaSi_2$, combinations of such material, or other suitable materials. The conductive layer 130 may comprise a plurality of layers. Other structures and/or configurations of the conductive layer 130 are within the scope of the present disclosure. In some embodiments, the sacrificial layer 135 comprises polysilicon and/or other suitable materials. Other structures and/or configurations of the sacrificial layer 135 are within the scope of the present disclosure.

According to some embodiments, the mask 140 comprises a plurality of individually formed layers that together define a mask stack. In some embodiments, the mask 140 comprises at least one of a hard mask layer, a bottom antireflective coating (BARC) layer, an organic planarization layer (OPL), or a photoresist layer. The hard mask layer is formed by at least one of PVD, CVD, spin on, growth, or other suitable techniques. In some embodiments, the hard mask layer comprises at least one of silicon (e.g., polycrystalline silicon), oxygen, nitrogen, or other suitable materials. In some embodiments, the BARC layer is a polymer layer that is applied using a spin coating process. In some embodiments, the OPL comprises a photo-sensitive organic polymer that is applied using a spin coating process. In some embodiments, the OPL comprises a dielectric layer. In some embodiments, the photoresist layer is formed by at least one of spinning, spray coating, or other suitable techniques. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist. One or more etchants have a selectivity such that the one or more etchants remove or etch away one or more layers exposed or not covered by the photoresist at a greater rate than the one or more etchants remove or etch away the photoresist. Accordingly, an opening in the photoresist allows the one or more etchants to form a corresponding opening in the one or more layers under the photoresist, and thereby transfer a pattern in the photoresist to the one or more layers under the photoresist. The photoresist is stripped or washed away after the pattern transfer. The layers of the mask stack are patterned to define the mask 140. In some embodiments, the photoresist layer is exposed using a radiation source and a reticle to define a pattern in the photoresist layer, and portions of the photoresist layer are removed to define a patterned photoresist layer. The underlying OPL, BARC layer, and hard mask layer are etched using the patterned photoresist layer as a template to form the mask 140 and expose portions of the sacrificial layer 135 under the mask 140. Other structures and/or configurations of the mask 140 are within the scope of the present disclosure.

Figure 3:
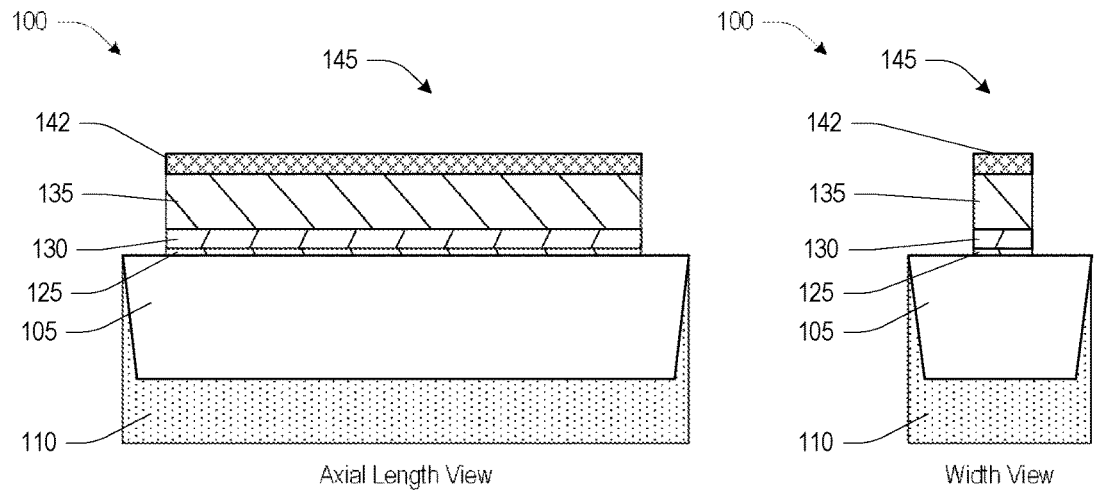

Referring to FIG. 3, the dielectric layer 125, the conductive layer 130, and the sacrificial layer 135 are patterned using the mask 140 as a removal template to define a line 145, in accordance with some embodiments. An etching processes is performed using the mask 140 as an etch template to pattern the dielectric layer 125, the conductive layer 130, and the sacrificial layer 135 to define the line 145. In some embodiments, the etching process is at least one of a plasma etching process, a reactive ion etching (RIE) process, or other suitable techniques. In some embodiments, the chemistry of the etching process may be changed from a first etch chemistry for etching the sacrificial layer 135, to a second etch chemistry for etching the conductive layer 130, to a third etch chemistry for etching the dielectric layer 125. In some embodiments, the mask 140 remains over the line 145 and functions as a cap layer 142.

Figure 4:
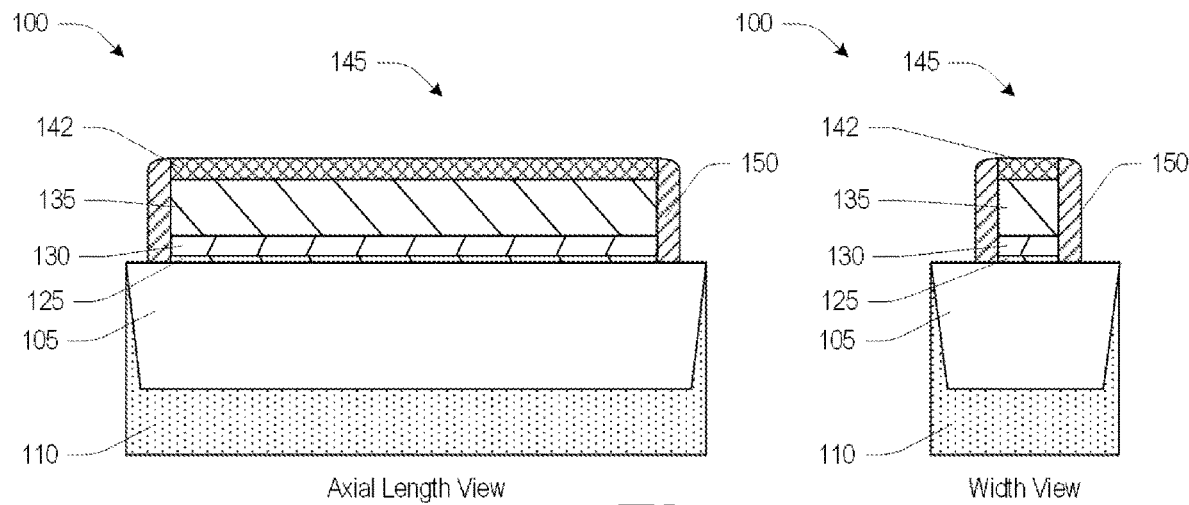

Referring to FIG. 4, a sidewall spacer 150 is formed adjacent the line 145, according to some embodiments. In some embodiments, the sidewall spacer 150 is formed by depositing a conformal spacer layer over the line 145 and performing an anisotropic etch process to remove portions of the spacer layer positioned on horizontal surfaces of the line 145, the semiconductor layer 110, and the STI structure 105. The sidewall spacer 150 may comprise the same material composition as the cap layer 142. The sidewall spacer 150 may comprise nitrogen, silicon and/or other suitable materials. Other structures and/or configurations of the sidewall spacer 150 are within the scope of the present disclosure.

Figure 5:
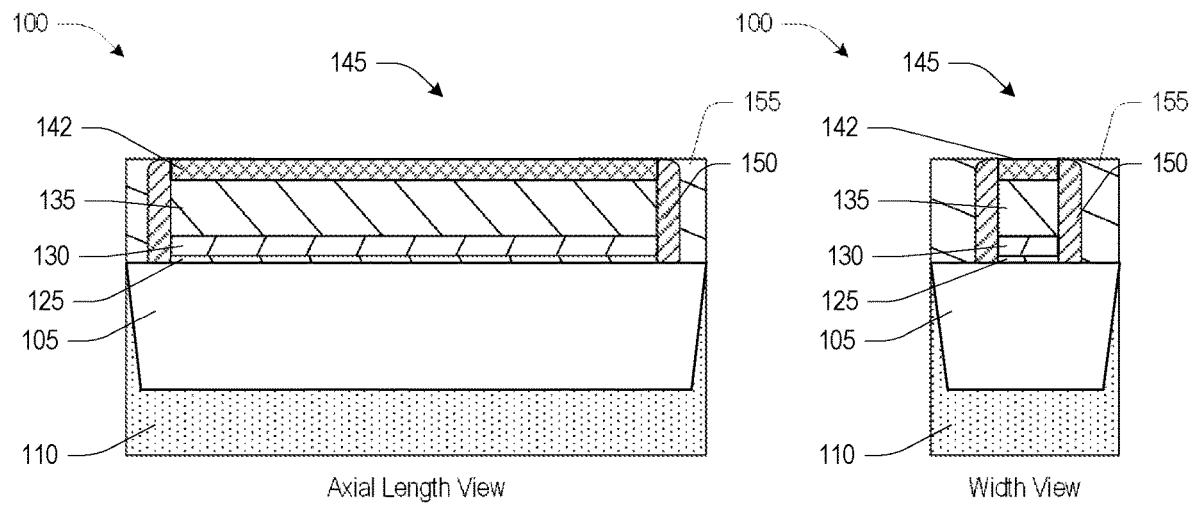

Referring to FIG. 5, a dielectric layer 155 is formed over the cap layer 142, the sidewall spacer 150, and the STI structures 105, according to some embodiments. In some embodiments, the dielectric layer 155 is planarized to expose the cap layer 142. In some embodiments, the dielectric layer 155 comprises at least one of silicon dioxide, a low-k material, or other suitable materials. In some embodiments, the dielectric layer 155 comprises one or more layers of low-k dielectric material. Low-k dielectric materials have a k-value (dielectric constant) lower than about 3.9. Some low-k dielectric materials have a k-value lower than about 3.5 and may have a k-value lower than about 2.5. The materials for the dielectric layer 155 comprise at least one of Si, O, C, H, SiCOH, SiOC, nitrogen, polymers, a carbon-containing material, organo-silicate glass, a porogen-containing material, or other suitable materials. The dielectric layer 155 is formed using CVD, LPCVD, PECVD, UHVCVD, RPCVD, ALD, physical vapor deposition, pulsed laser deposition, sputtering, evaporative deposition, VPE, MBE, LPE, spin-on, growth, and/or other suitable techniques. Other structures and/or configurations of the dielectric layer 155 are within the scope of the present disclosure.

Figure 6:
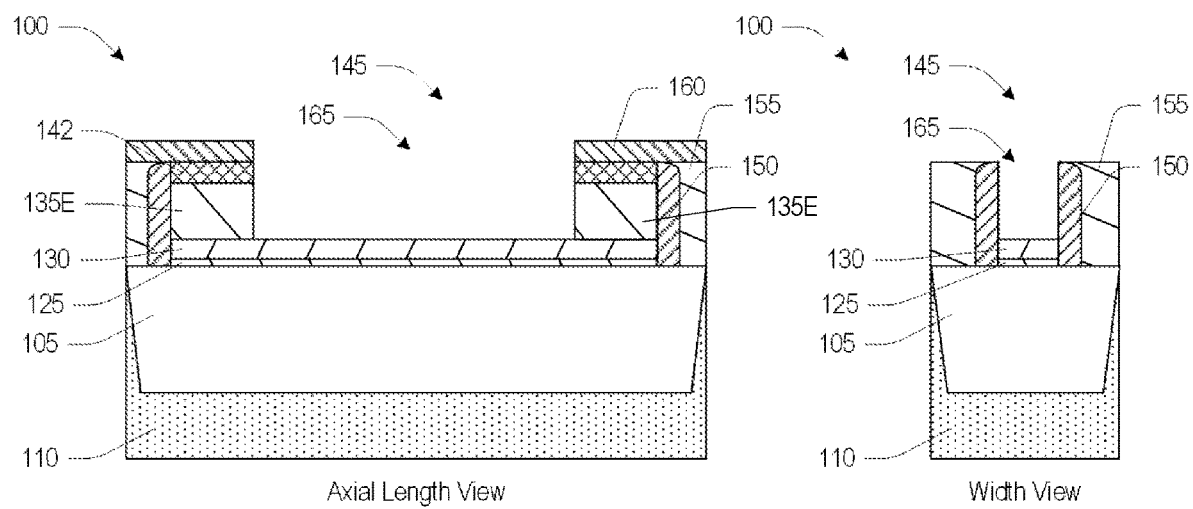

Referring to FIG. 6, a mask 160 is formed over ends of the line 145 and portions of the cap layer 142 and the sacrificial layer 135 are removed to define a cavity 165, according to some embodiments. The cavity 165 is bounded by end portions 135E of the sacrificial layer 135. In some embodiments, the mask 160 is formed using at least one of a hard mask layer, a BARC layer, an OPL, or a photoresist layer comprising materials and formed as described herein. At least one etching process is performed using the mask 160 as an etch template to remove the portions of the cap layer 142 and the sacrificial layer 135 not covered by the mask 160 to define the cavity 165. Other structures and/or configurations of the mask 160 are within the scope of the present disclosure.

Figure 7:
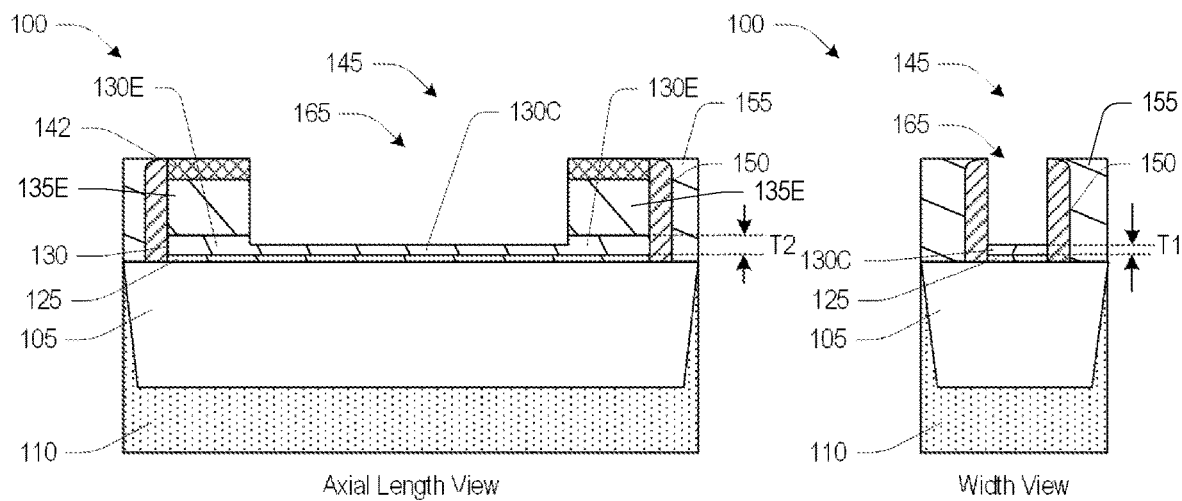

Referring to FIG. 7, a portion of the conductive layer 130 between ends 130E of the conductive layer 130 is removed to define a portion 130C, in accordance with some embodiments. The portion 130C has a thickness, T1, less than a thickness, T2, of the ends 130E. The portion of the conductive layer 130 may be removed by providing an over-etch time period for the etching process to remove the sacrificial layer 135 in FIG. 6 or by providing a different etch chemistry for a second etching process.

Figure 8:
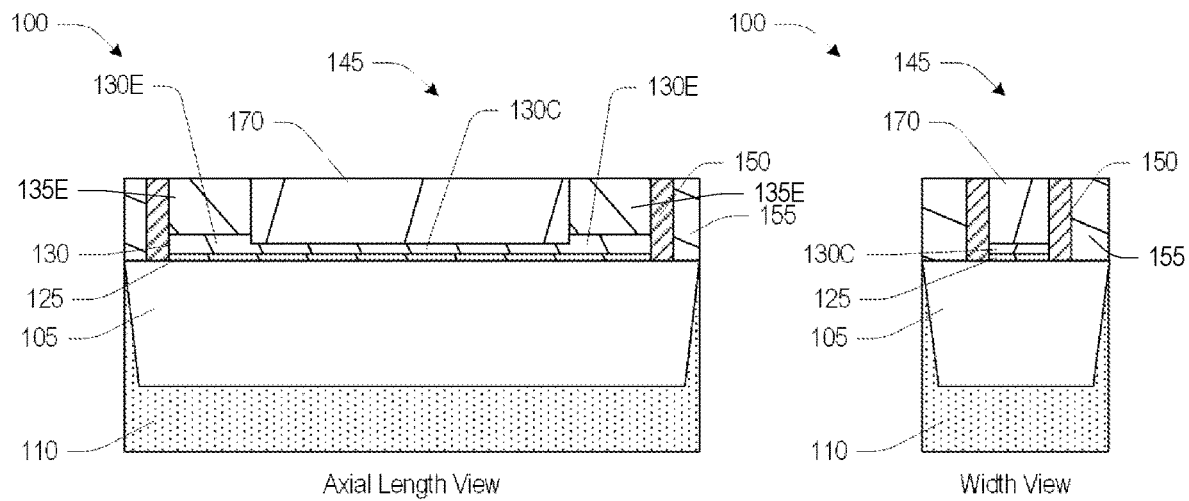

Referring to FIG. 8, a dielectric layer 170 is formed in the cavity 165 and the cap layer 142, portions of the sidewall spacer 150, and portions of the dielectric layer 155 are removed, in accordance with some embodiments. The dielectric layer 170 is formed in the cavity 165 and over the cap layer 142 and the dielectric layer 155. In some embodiments, the dielectric layer 170 comprises at least one of silicon dioxide, a low-k material, or other suitable materials. The dielectric layer 170 is formed using CVD, LPCVD, PECVD, UHVCVD, RPCVD, ALD, physical vapor deposition, pulsed laser deposition, sputtering, evaporative deposition, VPE, MBE, LPE, spin-on, growth, and/or other suitable techniques. A planarization process, such as chemical mechanical planarization (CMP) is performed to remove portions of the dielectric layer 170 over the cap layer 142 and the dielectric layer 155, to remove the cap layer 142, and to reduce a height of the sidewall spacer 150. Removal of the cap layer 142 exposes the sacrificial layer 135. Other structures and/or configurations of the dielectric layer 170 are within the scope of the present disclosure.

Figure 9:
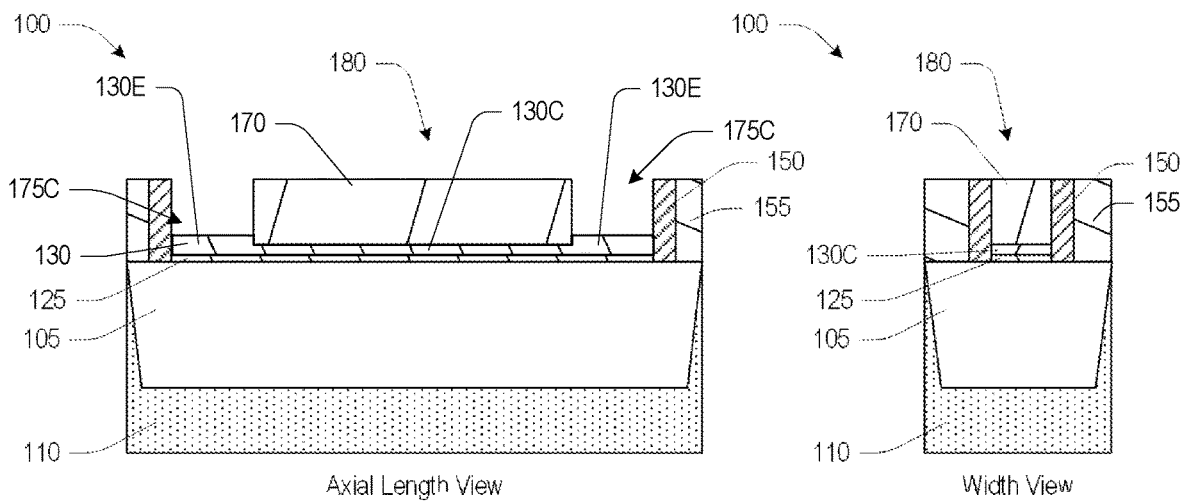

Referring to FIG. 9, the end portions 135E of the sacrificial layer 135 are removed to define electrode cavities 175C, in accordance with some embodiments. An etching process is performed to remove the end portions 135E of the sacrificial layer 135. In some embodiments, the etching process is selective to the material of the sacrificial layer 135.

Figure 10:
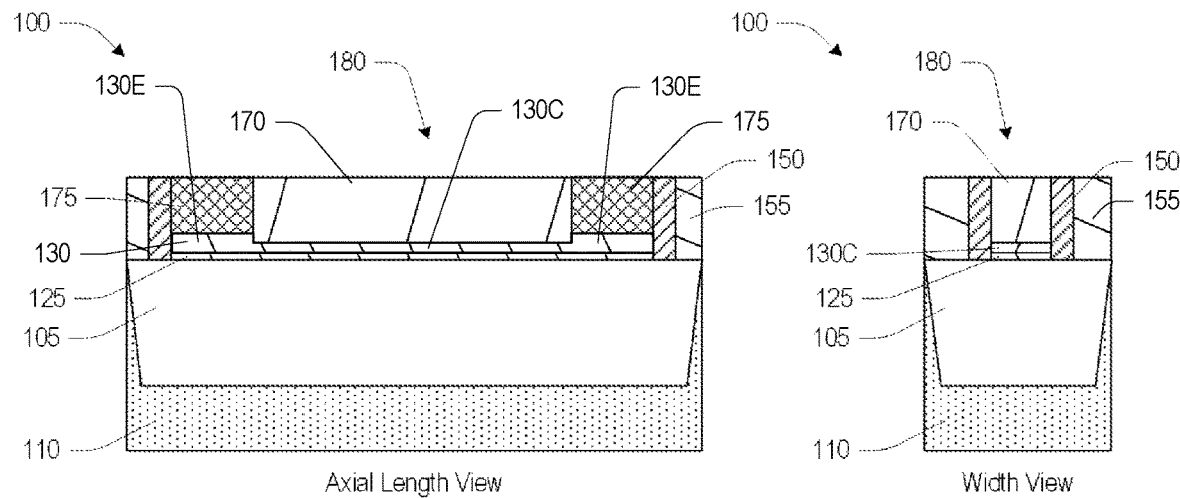

Referring to FIG. 10, electrodes 175 are formed in the electrode cavities 175C, in accordance with some embodiments. In some embodiments, the electrodes 175 comprise any number of suitable layers in a metal gate stack. In some embodiments, the metal gate stack comprises a work function material (WFM) layer. Example p-type work function metals include Mo, Ru, Ir, Pt, PtSi, MON, TIN, Al, W, HfN, WN, NiSi$_x$, ZrSi$_2$, MoSi$_2$, and/or TaSi$_2$. At least some p-type work function materials have work functions greater than about 4.5. Example n-type work function metals include Ti, Al, Ta, ZrSi$_2$, Ag, TaN, TaAl, TaAlC, TiAlN, TaC, TaCN, TaSiN, TaSi$_x$, Mn, and/or Zr. At least some n-type work function materials have work functions less than about 4.5. The WFM layer may comprise a plurality of layers. In some embodiments, a barrier layer is formed prior to the formation of WFM layer. The WFM layer is formed by at least one of CVD, PVD, electroplating, or other suitable techniques. In some embodiments, the metal gate stack comprises a fill layer. In some embodiments, the fill layer comprises at least one of tungsten (W) or other suitable materials. The fill layer may be formed by at least one of ALD, PVD, CVD, or other suitable techniques. According to some embodiments, a planarization process is performed to remove portions of the material forming the electrodes 175 outside the electrode cavities. The dielectric layer 170 is positioned laterally between the electrodes 175. Other structures and/or configurations of the electrodes 175 are within the scope of the present disclosure.

In an embodiment where the electrodes 175 are formed in parallel with a metal gate replacement process for forming gate structures for transistors, a gate dielectric layer may be formed prior to forming the electrodes. A masked etch process may be used to remove the gate dielectric layer prior to forming the electrodes 175 so the electrodes 175 contact the ends 130E of the conductive layer 130.

Figure 11:
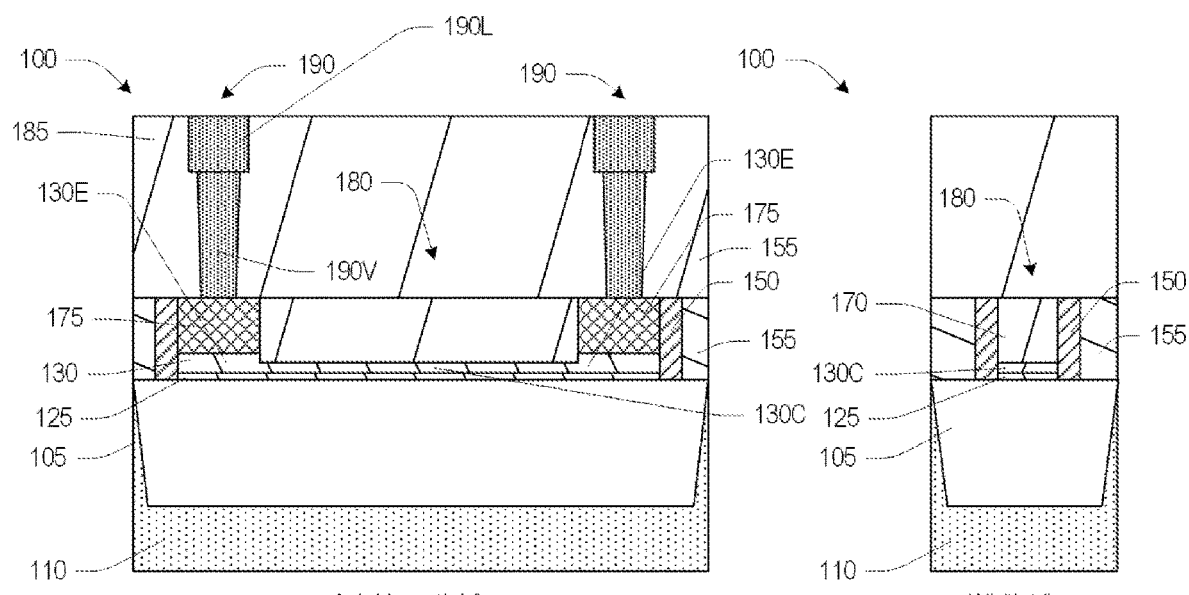

Referring to FIG. 11, a dielectric layer 185 is formed over the resistor 180 and an interconnect structure 190 is formed in the dielectric layer 185, according to some embodiments. In some embodiments, the interconnect structure 190 comprises a line portion 190L and a via portion 190V. In some embodiments, the interconnect structure 190 is formed in any number of ways, such as by a single damascene process, a dual damascene process, a trench silicide process, and/or other suitable techniques. In some embodiments, the interconnect structure 190 comprises a barrier layer, a seed layer, a metal fill layer, and/or other suitable layers. In some embodiments, the metal fill layer comprises tungsten, aluminum, copper, cobalt, and/or other suitable materials. Other structures and/or configurations of the interconnect structure 190 are within the scope of the present disclosure. In some embodiments, the via portions 190V of the interconnect structure 190 contact the electrodes 175. The via portions 190V may be located in a device layer of the semiconductor structure 100 and the line portions 190L may be located in a first metallization layer, such as an M1 layer, of the semiconductor structure 100.

The dielectric layer 125, the conductive layer 130, and the electrodes 175 define a resistor 180. Reducing the thickness of the portion 130C of the conductive layer 130 increases the resistance of the resistor per unit area. The increased resistance allows the resistor 180 to have a smaller footprint, thereby increasing device density.

FIGS. 12-16 illustrate the semiconductor structure 100 at various stages of fabrication, in accordance with some embodiments. FIGS. 12-16 illustrate implementation of both a removal process, such as an etch process, and a modification process, such as an oxidation process, to reduce a thickness of a conductive layer, according to some embodiments. FIGS. 12-16 include an axial length view of a resistor to be formed in the semiconductor structure 100 taken in a direction corresponding to an axial length of the resistor and a width view taken through the resistor in a direction corresponding to a width of the resistor. The process flow of FIGS. 12-16 starts with the semiconductor structure 100 shown in FIG. 7, where the portion 130C of the conductive layer 130 has been thinned in FIG. 7 and thus further thinning of the conductive layer 130 by a modification process is depicted in FIGS. 12-16.

Figure 12:
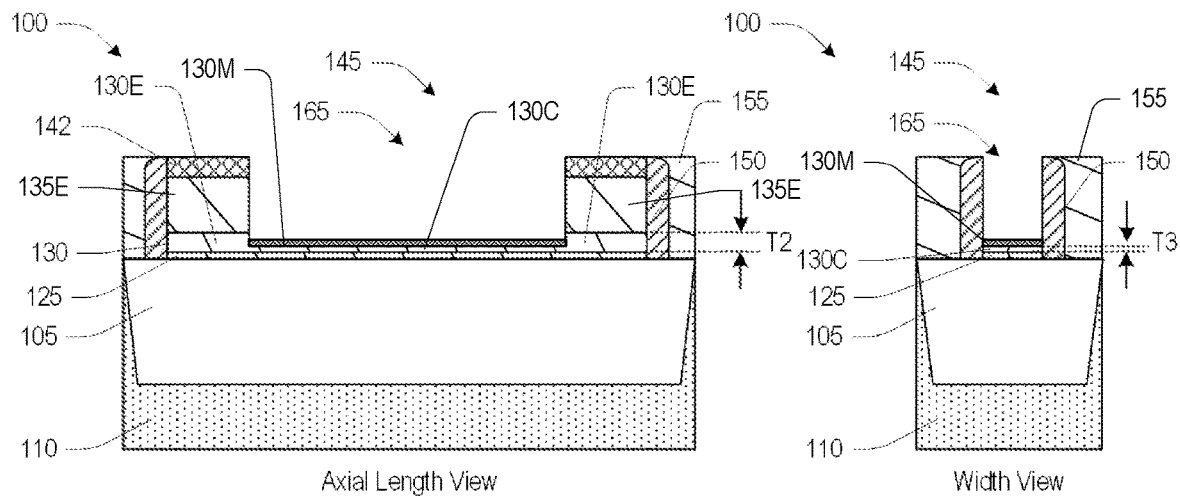
FIGS. 12-16 are illustrations of a semiconductor structure at various stages of fabrication, in accordance with some embodiments.

Referring to FIG. 12, a portion of the portion 130C is modified to form a dielectric layer 130M, in accordance with some embodiments. A material of the dielectric layer 130M has a resistance greater than a material of the conductive layer 130. The portion 130C may be modified using an oxidation process, such as a thermal oxidation process, a plasma oxidation process, or some other suitable oxidation process, to form an oxide of the material of the conductive layer 130 to form the dielectric layer 130M. For example, for a conductive layer 130 material of TiN, the material of the dielectric layer 130M is TiON. Forming the dielectric layer 130M further decreases the thickness, T3, of the remaining material of the portion 130C.

Figure 13:
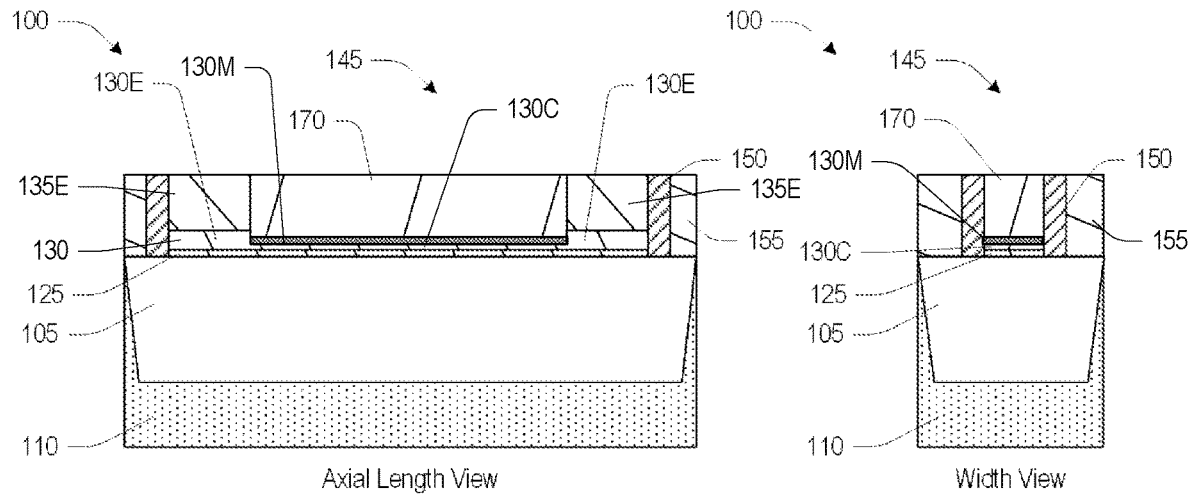

Referring to FIG. 13, a dielectric layer 170 is formed in the cavity 165 and the cap layer 142, portions of the sidewall spacer 150, and portions of the dielectric layer 155 are removed, in accordance with some embodiments. The dielectric layer 170 is formed in the cavity 165 and over the cap layer 142 and the dielectric layer 155. A planarization process, such as chemical mechanical planarization (CMP) is performed to remove portions of the dielectric layer 170 over the cap layer 142 and the dielectric layer 155, to remove the cap layer 142, and to reduce a height of the sidewall spacer 150. Removal of the cap layer 142 exposes the sacrificial layer 135.

Figure 14:
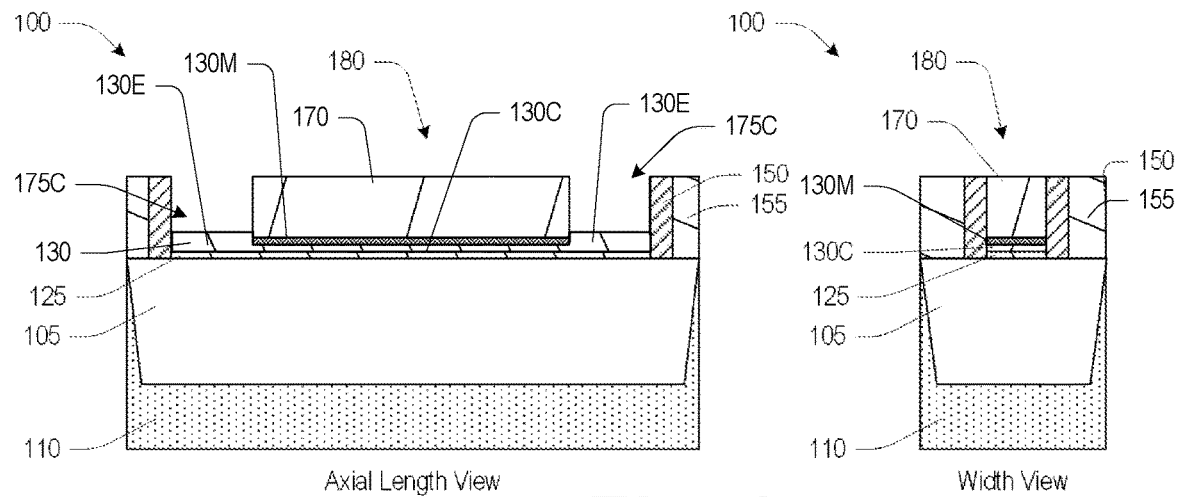

Referring to FIG. 14, the end portions 135E of the sacrificial layer 135 are removed to define electrode cavities 175C, in accordance with some embodiments. An etching process is performed to remove the end portions 135E of the sacrificial layer 135. In some embodiments, the etching process is selective to the material of the sacrificial layer 135.

Figure 15:
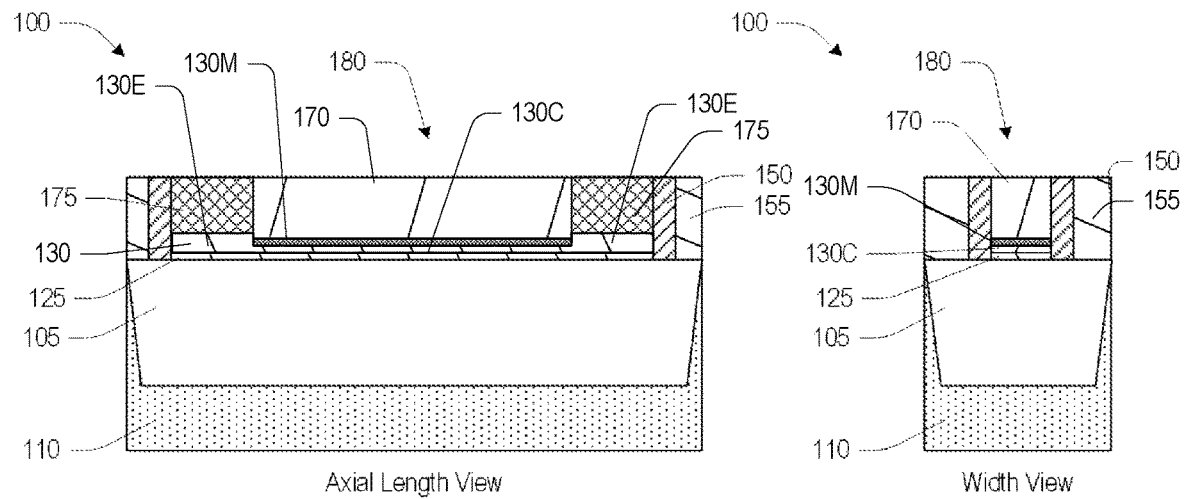

Referring to FIG. 15, electrodes 175 are formed in the electrode cavities 175C, in accordance with some embodiments. In some embodiments, the electrodes 175 comprise any number of suitable layers in a metal gate stack. In some embodiments, the metal gate stack comprises a work function material (WFM) layer. Example p-type work function metals include Mo, Ru, Ir. Pt. PtSi, MON, TIN, Al, W, HfN, WN, $NiSi_x$, $ZrSi_2$, $MoSi_2$, and/or $TaSi_2$. At least some p-type work function materials have work functions greater than about 4.5. Example n-type work function metals include Ti, Al, Ta, $ZrSi_2$, Ag. TaN, TaAl, TaAlC, TiAlN, TaC, TaCN, TaSiN, $TaSi_x$, Mn, and/or Zr. At least some n-type work function materials have work functions less than about 4.5. The WFM layer may comprise a plurality of layers. In some embodiments, a barrier layer is formed prior to the formation of WFM layer. The WFM layer is formed by at least one of CVD, PVD, electroplating, or other suitable techniques. In some embodiments, the metal gate stack comprises a fill layer. In some embodiments, the fill layer comprises at least one of tungsten (W) or other suitable materials. The fill layer may be formed by at least one of ALD, PVD, CVD, or other suitable techniques. According to some embodiments, a planarization process is performed to remove portions of the material forming the electrodes 175 outside the electrode cavities. The dielectric layer 170 is positioned laterally between the electrodes 175. Other structures and/or configurations of the electrodes 175 are within the scope of the present disclosure.

In an embodiment where the electrodes 175 are formed in parallel with a metal gate replacement process for forming gate structures for transistors, a gate dielectric layer may be formed prior to forming the electrodes. A masked etch process may be used to remove the gate dielectric layer prior to forming the electrodes 175 so the electrodes 175 contact the ends 130E of the conductive layer 130.

Figure 16:
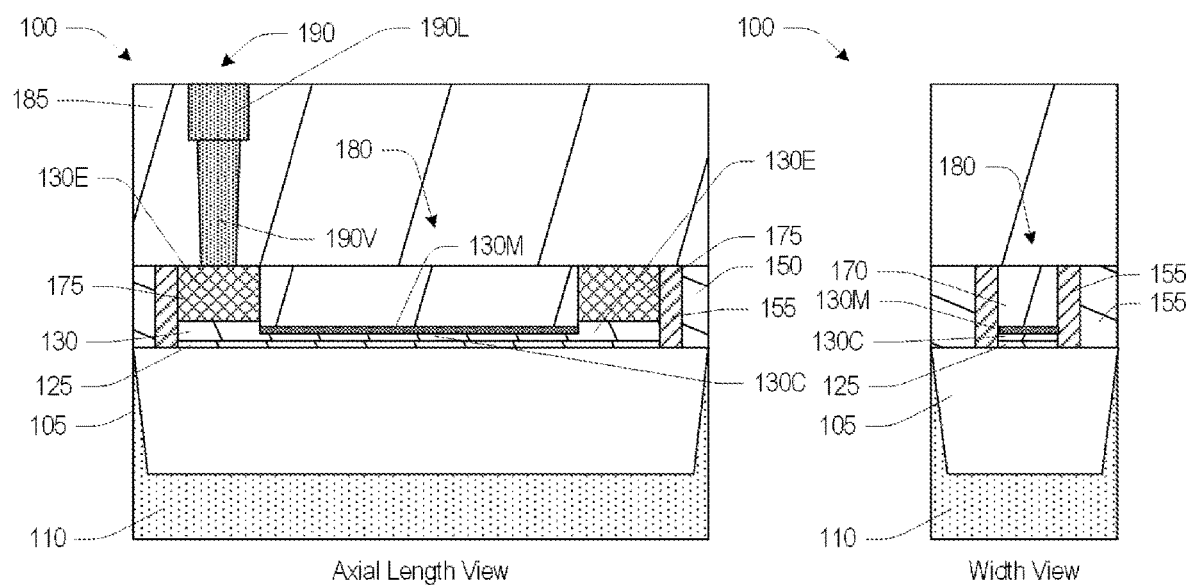

Referring to FIG. 16, a dielectric layer 185 is formed over the resistor 180 and an interconnect structure 190 is formed in the dielectric layer 185, according to some embodiments. In some embodiments, the interconnect structure 190 comprises a line portion 190L and a via portion 190V. In some embodiments, the interconnect structure 190 is formed in any number of ways, such as by a single damascene process, a dual damascene process, a trench silicide process, and/or other suitable techniques. In some embodiments, the interconnect structure 190 comprises a barrier layer, a seed layer, a metal fill layer, and/or other suitable layers. In some embodiments, the metal fill layer comprises tungsten, aluminum, copper, cobalt, and/or other suitable materials. Other structures and/or configurations of the interconnect structure 190 are within the scope of the present disclosure. In some embodiments, the via portions 190V of the interconnect structure 190 contact the electrodes 175. The via portions 190V may be located in a device layer of the semiconductor structure 100 and the line portions 190L may be located in a first metallization layer, such as an M1 layer, of the semiconductor structure 100.

The dielectric layer 125, the conductive layer 130, the dielectric layer 130M of the conductive layer 130, and the electrodes 175 define a resistor 180. Reducing the thickness of the portion 130C of the conductive layer 130 increases the resistance of the resistor per unit area. Forming the dielectric layer 130M further increases the resistance per unit area. The increased resistance allows the resistor 180 to have a smaller footprint, thereby increasing device density.

FIGS. 17-21 illustrate the semiconductor structure 100 at various stages of fabrication, in accordance with some embodiments. FIGS. 17-21 illustrate implementation of a modification process, such as an oxidation process, to reduce a thickness of a conductive layer, according to some embodiments. FIGS. 17-21 include an axial length view of a resistor to be formed in the semiconductor structure 100 taken in a direction corresponding to an axial length of the resistor and a width view taken through the resistor in a direction corresponding to a width of the resistor. The process flow of FIGS. 17-21 starts with the semiconductor structure 100 shown in FIG. 6.

Figure 17:
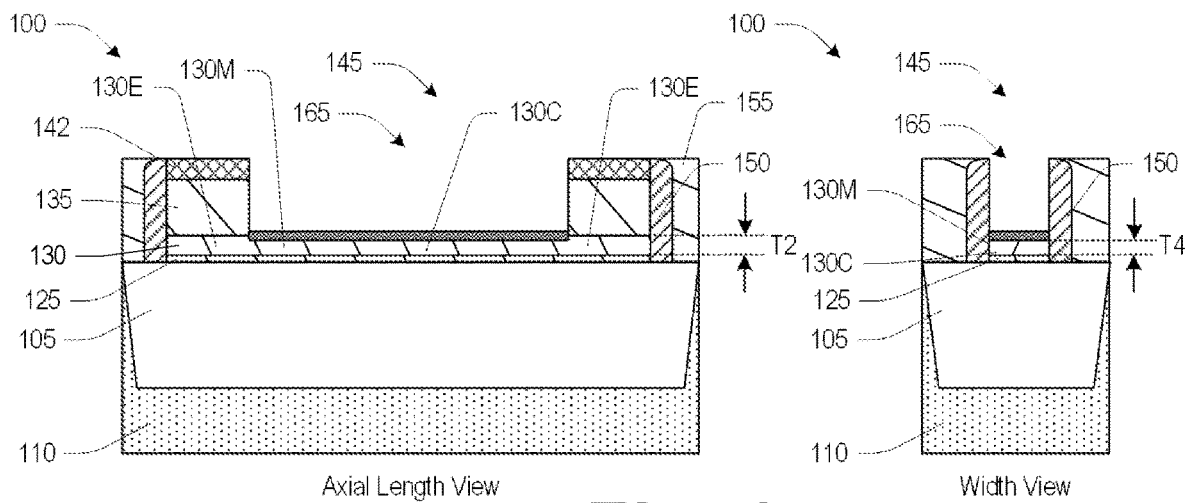
FIGS. 17-21 are illustrations of a semiconductor structure at various stages of fabrication, in accordance with some embodiments.

Referring to FIG. 17, a portion of the conductive layer 130 is modified to define a portion 130C and ends 130E of the conductive layer 130 and to form a dielectric layer 130M over the portion 130C, in accordance with some embodiments. The portion 130C has a thickness, T4, less than the thickness, T2, of the ends 130E. During the modification process, a portion of material of the conductive layer 130 is consumed resulting in the reduced thickness of the remaining material of the portion 130C. A material of the dielectric layer 130M has a resistance greater than a material of the conductive layer 130. The conductive layer 130 may be modified using an oxidation process, such as a thermal oxidation process, a plasma oxidation process, or some other suitable oxidation process, to form an oxide of the material of the conductive layer 130 to form the dielectric layer 130M. For example, for a conductive layer 130 material of TiN, the material of the dielectric layer 130M is TiON. Forming the dielectric layer 130M further decreases the thickness, T3, of the portion 130C.

Figure 18:
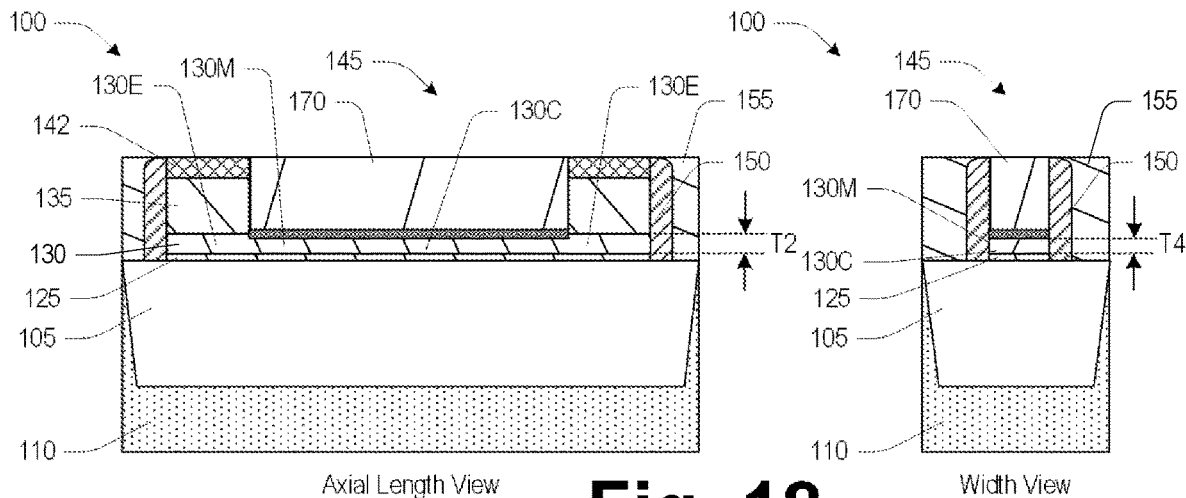

Referring to FIG. 18, a dielectric layer 170 is formed in the cavity 165 and the cap layer 142, portions of the sidewall spacer 150, and portions of the dielectric layer 155 are removed, in accordance with some embodiments. The dielectric layer 170 is formed in the cavity 165 and over the cap layer 142 and the dielectric layer 155. A planarization process, such as chemical mechanical planarization (CMP) is performed to remove portions of the dielectric layer 170 over the cap layer 142 and the dielectric layer 155, to remove the cap layer 142, and to reduce a height of the sidewall spacer 150. Removal of the cap layer 142 exposes the sacrificial layer 135.

Figure 19:
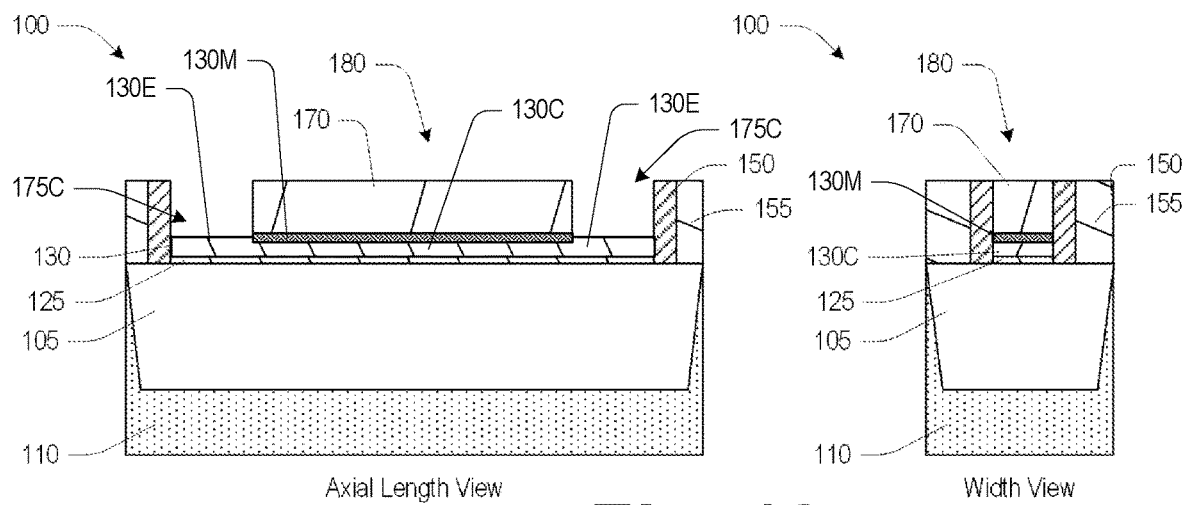

Referring to FIG. 19, the end portions 135E of the sacrificial layer 135 are removed to define electrode cavities 175C, in accordance with some embodiments. An etching process is performed to remove the end portions 135E of the sacrificial layer 135. In some embodiments, the etching process is selective to the material of the sacrificial layer 135.

Figure 20:
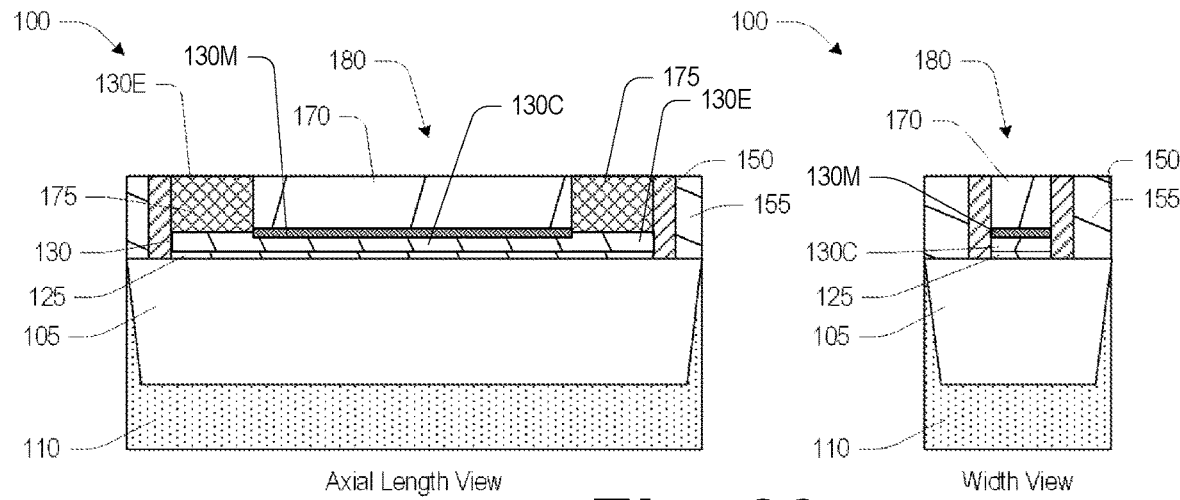

Referring to FIG. 20, electrodes 175 are formed in the electrode cavities 175C, in accordance with some embodiments. In some embodiments, the electrodes 175 comprise any number of suitable layers in a metal gate stack. In some embodiments, the metal gate stack comprises a work function material (WFM) layer. Example p-type work function metals include Mo, Ru, Ir, Pt, PtSi, MON, TIN, Al, W, HfN, WN, $NiSi_x$, $ZrSi_2$, $MoSi_2$, and/or $TaSi_2$. At least some p-type work function materials have work functions greater than about 4.5. Example n-type work function metals include Ti, Al, Ta, $ZrSi_2$, Ag, TaN, TaAl, TaAlC, TiAlN, TaC, TaCN, TaSiN. $TaSi_x$, Mn, and/or Zr. At least some n-type work function materials have work functions less than about 4.5. The WFM layer may comprise a plurality of layers. In some embodiments, a barrier layer is formed prior to the formation of WFM layer. The WFM layer is formed by at least one of CVD, PVD, electroplating, or other suitable techniques. In some embodiments, the metal gate stack comprises a fill layer. In some embodiments, the fill layer comprises at least one of tungsten (W) or other suitable materials. The fill layer may be formed by at least one of ALD, PVD, CVD, or other suitable techniques. According to some embodiments, a planarization process is performed to remove portions of the material forming the electrodes 175 outside the electrode cavities. The dielectric layer 170 is positioned laterally between the electrodes 175. Other structures and/or configurations of the electrodes 175 are within the scope of the present disclosure.

In an embodiment where the electrodes 175 are formed in parallel with a metal gate replacement process for forming gate structures for transistors, a gate dielectric layer may be formed prior to forming the electrodes. A masked etch process may be used to remove the gate dielectric layer prior to forming the electrodes 175 so the electrodes 175 contact the ends 130E of the conductive layer 130.

Figure 21:
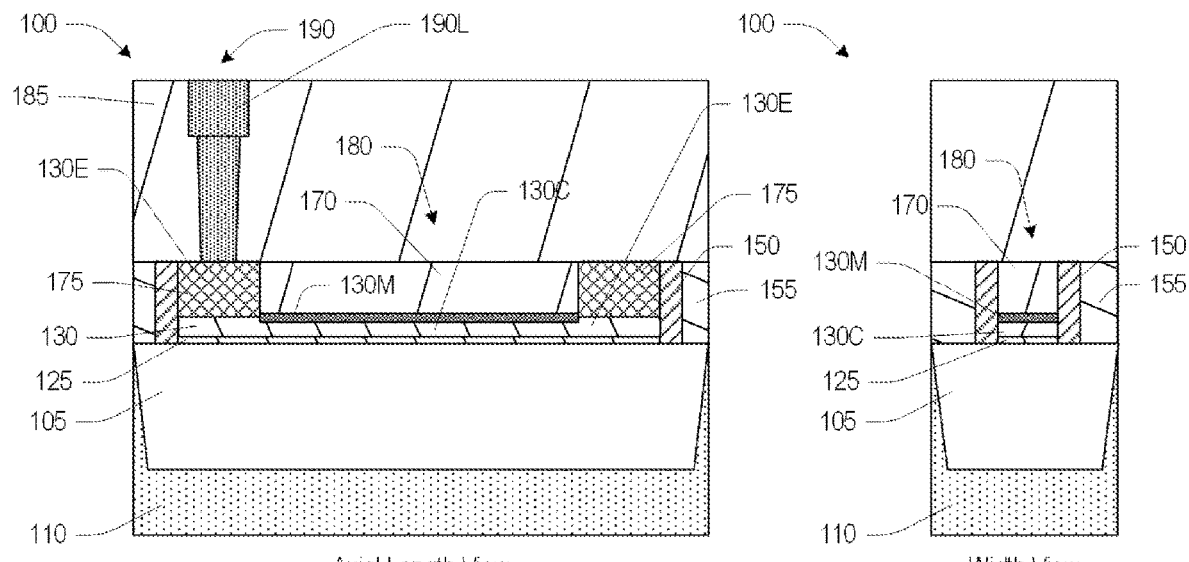

Referring to FIG. 21, a dielectric layer 185 is formed over the resistor 180 and an interconnect structure 190 is formed in the dielectric layer 185, according to some embodiments. In some embodiments, the interconnect structure 190 comprises a line portion 190L and a via portion 190V. In some embodiments, the interconnect structure 190 is formed in any number of ways, such as by a single damascene process, a dual damascene process, a trench silicide process, and/or other suitable techniques. In some embodiments, the interconnect structure 190 comprises a barrier layer, a seed layer, a metal fill layer, and/or other suitable layers. In some embodiments, the metal fill layer comprises tungsten, aluminum, copper, cobalt, and/or other suitable materials. Other structures and/or configurations of the interconnect structure 190 are within the scope of the present disclosure. In some embodiments, the via portions 190V of the interconnect structure 190 contact the electrodes 175. The via portions 190V may be located in a device layer of the semiconductor structure 100 and the line portions 190L may be located in a first metallization layer, such as an M1 layer, of the semiconductor structure 100.

The dielectric layer 125, the conductive layer 130, the dielectric layer 130M of the conductive layer 130, and the electrodes 175 define a resistor 180. Reducing the thickness of the portion 130C of the conductive layer 130 by forming he modified portion and consuming a portion of the conductive layer 130 increases the resistance of the resistor per unit area. The increased resistance allows the resistor 180 to have a smaller footprint, thereby increasing device density.

In some embodiments, a semiconductor structure is provided. The semiconductor structure has a first dielectric layer, a conductive layer over the first dielectric layer, and a first electrode over a first portion of the conductive layer. A first thickness of the first portion of the conductive layer is greater than a second thickness of a second portion of the conductive layer not under the first electrode.

In some embodiments, a method for forming a semiconductor structure is provided. The method includes forming a line having a first dielectric layer and a conductive layer over the first dielectric layer, where the conductive layer extends between a first end and a second end. The method includes reducing a thickness of a portion of the conductive layer between the first end and the second end. The method includes forming a first electrode over the first end of the conductive layer. A first thickness of the portion of the conductive layer between the first end and the second end is less than a second thickness of the first end of the conductive layer under the first electrode.

In some embodiments, a method for forming a semiconductor structure is provided. The method includes forming a line comprising a first dielectric layer, a conductive layer over the first dielectric layer, and a sacrificial layer over the conductive layer, where the conductive layer extends between a first end and a second end. The method includes removing a portion of the sacrificial layer over the conductive layer to define a first end portion of the sacrificial layer over the first end of the conductive layer and a second end portion of the sacrificial layer over the second end of the conductive layer. The method includes reducing a thickness of a portion of the conductive layer between the first end and the second end. The method includes forming a second dielectric layer over the portion of the conductive layer between the first end portion of the sacrificial layer and the second end portion of the sacrificial layer. The method includes removing the first end portion of the sacrificial layer to define a first cavity exposing the first end of the conductive layer, and removing the second end portion of the sacrificial layer to define a second cavity exposing the second end of the conductive layer. The method includes forming a first electrode in the first cavity, and forming a second electrode in the second cavity. After the thickness of the portion of the conductive layer is reduced, a first thickness of the portion of the conductive layer is less than a second thickness of the conductive layer under at least one of the first electrode or the second electrode.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and case of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for forming a semiconductor structure, comprising:
   forming a line comprising a first dielectric layer and a conductive layer over the first dielectric layer, wherein the conductive layer extends between a first end and a second end;
   reducing a thickness of a portion of the conductive layer between the first end and the second end, wherein reducing the thickness of the portion of the conductive layer comprises:
     converting some of the conductive layer between the first end and the second end to a second dielectric layer;
   forming a third dielectric layer over the second dielectric layer; and
   forming a first electrode over the first end of the conductive layer, wherein:

a first thickness of the portion of the conductive layer between the first end and the second end is less than a second thickness of the first end of the conductive layer under the first electrode.

2. The method of claim 1, wherein forming the first electrode comprises:
forming the first electrode to contact the third dielectric layer.

3. The method of claim 1, wherein reducing the thickness of the portion of the conductive layer comprises:
performing an etching process to remove some of the conductive layer between the first end and the second end before converting some of the conductive layer between the first end and the second end to the second dielectric layer.

4. The method of claim 1, wherein:
converting some of the conductive layer comprises oxidizing some of the conductive layer between the first end and the second end to form the second dielectric layer.

5. The method of claim 1, comprising:
forming a second electrode over the second end of the conductive layer, wherein:
the first thickness of the portion of the conductive layer between the first end and the second end is less than a third thickness of the second end of the conductive layer under the second electrode.

6. A method for forming a semiconductor structure, comprising:
forming a line comprising a first dielectric layer, a conductive layer over the first dielectric layer, and a sacrificial layer over the conductive layer, wherein the conductive layer extends between a first end and a second end;
removing a portion of the sacrificial layer over the conductive layer to define a first end portion of the sacrificial layer over the first end of the conductive layer and a second end portion of the sacrificial layer over the second end of the conductive layer;
reducing a thickness of a portion of the conductive layer between the first end and the second end;
forming a second dielectric layer over the portion of the conductive layer between the first end portion of the sacrificial layer and the second end portion of the sacrificial layer;
removing the first end portion of the sacrificial layer to define a first cavity exposing the first end of the conductive layer;
removing the second end portion of the sacrificial layer to define a second cavity exposing the second end of the conductive layer;
forming a first electrode in the first cavity; and
forming a second electrode in the second cavity, wherein:
after the thickness of the portion of the conductive layer is reduced, a first thickness of the portion of the conductive layer is less than a second thickness of the conductive layer under at least one of the first electrode or the second electrode.

7. The method of claim 6, wherein reducing the thickness of the portion of the conductive layer comprises:
performing an etching process to remove some of the conductive layer between the first end and the second end.

8. The method of claim 6, wherein reducing the thickness of the portion of the conductive layer comprises:
converting some of the conductive layer between the first end and the second end to a third dielectric layer.

9. The method of claim 8, wherein:
converting some of the conductive layer comprises oxidizing some of the conductive layer between the first end and the second end to form the third dielectric layer.

10. The method of claim 8, wherein:
the conductive layer comprises titanium and nitrogen; and
the third dielectric layer comprises titanium, nitrogen, and oxygen.

11. The method of claim 6, comprising:
forming a sidewall spacer adjacent the line; and
forming a third dielectric layer adjacent the sidewall spacer, wherein:
forming the line comprises forming a cap layer over the sacrificial layer;
removing the portion of the sacrificial layer over the conductive layer comprises:
forming a mask over the third dielectric layer and over portions of the cap layer over the first end portion of the sacrificial layer and the second end portion of the sacrificial layer;
removing a portion of the cap layer over the portion of the sacrificial layer over the conductive layer; and
removing the portion of the sacrificial layer over the conductive layer to define a third cavity; and
forming the second dielectric layer over the portion of the conductive layer comprises forming the second dielectric layer in the third cavity.

12. The method of claim 11, comprising:
performing a planarization process to remove the cap layer, a portion of the sidewall spacer, and a portion of the third dielectric layer.

13. A method for forming a semiconductor structure, comprising:
forming a conductive layer;
forming a sidewall spacer on a first side and a second side of the conductive layer;
removing a first portion of the conductive layer after forming the sidewall spacer to reduce a height of a second portion of the conductive layer to a first height; and
forming a first dielectric layer over the second portion of the conductive layer.

14. The method of claim 13, comprising:
forming an electrode between the first dielectric layer and the sidewall spacer.

15. The method of claim 13, wherein:
a third portion of the conductive layer between the second portion of the conductive layer and the sidewall spacer has a second height, greater than the first height, after removing the first portion of the conductive layer.

16. The method of claim 15, comprising:
forming an electrode over the third portion of the conductive layer.

17. The method of claim 13, comprising:
forming a second dielectric layer over the conductive layer prior to forming the sidewall spacer, and
removing a first portion of the second dielectric layer to expose the first portion of the conductive layer.

18. The method of claim 17, wherein forming the first dielectric layer comprises forming the first dielectric layer to contact a second portion of the second dielectric layer.

19. The method of claim 1, comprising:
forming a sidewall spacer on a first side and a second side of the conductive layer, wherein reducing the thickness of the portion of the conductive layer comprises reducing the thickness of the portion of the conductive layer after forming the sidewall spacer.

20. The method of claim 1, wherein:
the line comprises a sacrificial layer over the conductive layer,
the method comprises removing a portion of the sacrificial layer over the first end of the conductive layer to define a cavity, and
forming the first electrode comprises forming the first electrode in the cavity.

* * * * *